Dec. 7, 1965 H. G. LEE ET AL 3,222,450

ENCAPSULATING FOR ELECTRICAL COMPONENT AND TERMINAL MEANS THEREWITH

Filed June 20, 1963 2 Sheets-Sheet 1

INVENTORS
Henry George Lee
Barton L. Weller
Harlan P. Tripp

BY Johnson and Kline
ATTORNEYS

INVENTORS
Henry George Lee
Barton L. Weller
Harlan P. Tripp
BY Johnson and Kline
ATTORNEYS

United States Patent Office 3,222,450
Patented Dec. 7, 1965

3,222,450

ENCAPSULATING FOR ELECTRICAL COMPONENT AND TERMINAL MEANS FOR USE THEREWITH

Henry George Lee, Denham, Bucks, England, and Barton L. Weller, Monroe, and Harlan P. Tripp, Easton, Conn., assignors to Vitramon, Incorporated, Monroe, Conn., a corporation of Delaware Filed June 20, 1963, Ser. No. 289,202
3 Claims. (Cl. 174—52)

This invention relates to encapsulated electrical components, including hermetically sealed components. More specifically, it pertains to terminal lead connections for such components.

Prior to this invention it has been the practice in the manufacture of encapsulated electrical components, such as capacitors, to make the required terminal lead connections prior to insertion of the component body into the casing. While this prior practice has proven satisfactory where the encapsulating casing is open ended and the leads project outwardly through the open end, it presents problems in positioning the component body where the leads are received in preformed openings in the wall of the casing; extreme care and accuracy is required in making the terminal lead connections and in final assembly so that the component body and leads are positioned in the casing as required, thus increasing the cost of manufacture of the finished component. Further, distortion or misalignment of the leads, as a result of handling during assembly, may also result in an undesirable positioning of the component body in the casing.

In hermetically sealed components the problems of assembly are multiplied, where the terminal lead connections are made prior to insertion of the component body in the casing, since the leads must not only be inserted through preformed openings in the casing and the unit properly seated therein, but the leads must be sealably connected to the casing at the opening to facilitate the hermetic seal.

The present invention overcomes the problems aforenoted and has as an important object thereof to provide an encapsulated component of such construction that the terminal lead connections are readily made after the component body is inserted in the encapsulating casing.

It is also an object of the invention to provide an encapsulated electrical component having terminal means cooperating with the casing and so shaped and disposed relative thereto that they engage, in a predetermined manner, a component body inserted in the casing for electrically communicating the body outwardly of the casing for connection in an electrical circuit.

Another object of the invention is to provide an encapsulated hermetically sealed electrical component, including a component body, terminal means and a casing in which the parts are readily manufactured and then assembled with assurance of a resultant highly reliable sealed end product.

Another object of the invention is to provide a hermetically sealed or other encapsulated electrical component, having terminal means, cooperatively associated with the casing and adapted to electrically engage a component body inserted in the casing in a predetermined manner for connecting the component into an electrical circuit external of the casing, which is adapted to make the ultimate circuit connection through a conventional lead wire or, as an alternative, by direct connection of the terminal means into the circuit.

Another object of the invention is to provide improved terminal means for use in the manufacture of encapsulated electrical components, which are adapted to be predeterminately positioned relative to the casing prior to insertion of the component body therein so that, on insertion of the body, electrical contact is made therewith by the terminal means in the desired manner, whereby the component may be connected into an electrical circuit.

Still another object of the invention is to provide a terminal means for use in making encapsulated electrical components, having a tubular body portion and an integral, offset, substantially flattened foot portion, which is adapted to be positioned relative the casing for engaging in a predetermined manner, a body inserted therein, the tubular body portion being exposed outwardly of the casing for receiving a lead wire or directly functioning to connect the component into an electrical circuit.

It is further an object of the invention to provide a hermetically sealed component including an open ended ceramic casing for receiving the component body, the casing having openings in its closed end in which terminal means are disposed for connecting the component into an electrical circuit, and a ceramic cap for closing the open end of the casing, the open end edges of the casing, the casing engaging edges of the cap and terminal receiving openings being metallized, whereby the casing may be completely sealed from the atmosphere.

Other objects and advantages of the invention will be apparent from the specification and claims when considered in connection with the attached sheets of drawings, illustrating one form of the invention, wherein like characters represent like parts, and in which:

Figures 1, 2:
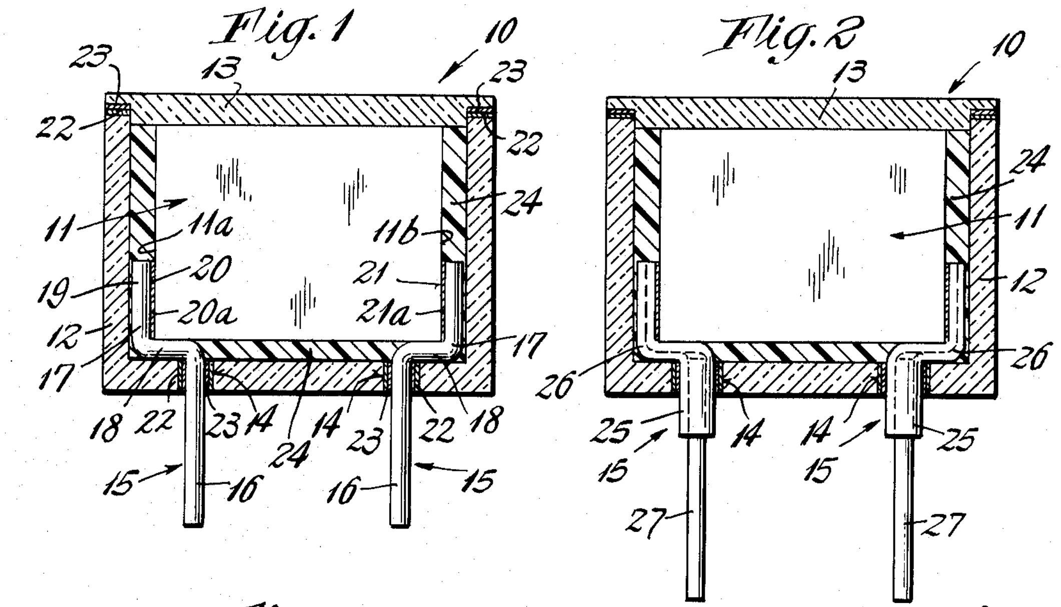
FIGURE 1 is a side elevational view, in section, of a hermetically sealed capacitor according to the invention.
FIG. 2 is similar to FIG. 1 but embodies a modified form of terminal means.

Referring now to the drawings for a more detailed description of the invention, in FIGS. 1 through 4 an encapsulated electrical component construction 10 is shown embodying the concepts of the invention. While the component itself may be of any known type, such as a capacitor, resistor, inductor, or the like, or may comprise a combination of such units, in the illustrated embodiment of the invention the component is a capacitor represented by body 11. The capacitor, which may be a single dielectric wafer having electrodes on the opposite surfaces thereof, a stacked assembly of a number of such wafers or a monolithic block containing alternate dielectric and electrically conductive layers, all of which are well known to the art, includes at least two terminal electrodes 11*a* and 11*b* which must be connected to the electrical circuit for which the component is intended.

As illustrated in FIG. 1, the encapsulated component 10 is shown as a hermetically sealed device, though the concept of the invention is applicable to other encapsulated constructions, as will be discussed in connection with FIGS. 5 and 6. The encapsulated component as shown in FIG. 1 includes an open ended casing 12 of ceramic such as steatite or similar material, adapted to receive and house the component body 11, and a cap 13 of similar ceramic material for closing the open end of the casing. The casing 12, which is here illustrated as being rectangular in cross-section, but may have any desired cross-sectional configuration, is provided in its closed end with a plurality of openings 14 for receiving terminal means 15 which function to connect the component into a desired electrical circuit. In the instant embodiment of the invention the terminal means 15 connect the opposed electrodes 11*a* and 11*b* of the capacitor 11 into the electrical circuit.

Prior to the present invention it was the practice when inserting electrical components into encapsulating casings to affix the terminal means to the component body prior to such insertion. This practice, however, presented a number of problems, primarily relating to the excessive amount of handling required in assembling the component and casing and in properly positioning the component within the casing. According to the present invention these problems have been overcome by providing a unique terminal means which is adapated to be positioned in the casing prior to the insertion of the component therein, the electrical connection between the terminal means and the component being completed after assembly of the component and casing.

As shown in FIG. 1, one form of terminal means 15, according to the invention, comprises a lead wire 16 having an offset portion 17, the lead wire proper extending through the openings 14 in the casing and projecting outwardly thereof and the offset portion extending inside the casing adjacent the side walls. In the form of terminal means shown in FIG. 1 the offset portion 17 includes a first portion 18 integral with and extending normal to the lead wire proper and a second portion 19 integral with the portion 18 and extending parallel to and away from the lead wire proper. As seen, the offset portion 17 of the terminal means 15 provide, in effect, a pocket for receiving the component body 11 and are predeterminately shaped and positioned so that, on insertion of the body within the casing the offset portions of the terminal means engage the component in such a manner as to obtain the desired electrical connection. In the instant example, the offset portions of the terminal means engage the opposed electrodes 11*a* and 11*b* of the capacitor at 20 and 21, respectively.

While electrical connection may be obtained in any known manner, it is contemplated that the offset portions 17 will be pre-soldered or that solder will be provided at the joints, as shown at 20*a* and 21*a*, in any other known manner, so that by induction heating or similar means the solder will be caused to melt and make the connection.

As aforesaid, the component 10 of FIG. 1 is a hermetically sealed device and in order to assure the desired seal the ceramic casing 12 is metallized along its open end and edges and around the openings 14 as shown at 22. The cap 13 and the terminal means 15 are also metallized in areas engaging the open end edges of the casing and the openings 14, respectively, as shown at 23 so that on firing the component or heating the joints in any other known manner the metallized areas 22 and 23 bond to provide the required seal.

It should be noted that prior to sealing the component by attachment of the cap 13 the unit may be potted by filling all of the voids within the casing with epoxy or similar insulating or shock absorbing material 24, as is well known in the art.

It will be seen that in accordance with the invention, as embodied in FIG. 1, an encapsulated electrical component is provided of extremely reliable electrical and mechanical character.

In FIG. 2, a hermetically sealed component 10 is shown which is identical in all respects to that described with respect to FIG. 1, except that it includes a modified form of terminal means 15. The modified form of terminal means 15, as shown in enlarged detail in FIG. 7, includes a tubular body portion 25 and an integral offset portion 26, the offset portion being readily formed by mashing closed or flattening an end of the tubing 25 and bending it into the desired shape. The modified terminal means or thimble 15 is positioned in the casing 12, prior to insertion of the component body 11 therein, so that the tubular body 25 extends through the openings 14 and opens outwardly of the casing. It will be understood that the end of the tubular body 25 may be flush with the surface of the casing or may extend outwardly thereof, as desired. The offset portion of the thimble 15 extends inside the casing in a manner similar to the offset portion 17 described in connection with FIG. 1.

The thimble terminal means may be utilized for connecting the electrical component into a circuit by inserting lead wires 27 into the tubular portion, as shown in FIG. 2, or, as an alternative (see FIG. 5), where the tubular body portion 25 projects outwardly of the surface of the casing, the connection into the circuit may be achieved by passing such outwardly projecting tubular portion through openings 28 in a printed circuit board 29 or the like and then peening over the end of the tubular body portion to make the connection as shown at 30.

The modified terminal means or thimble 15 has a number of advantages over the lead wire type terminal means discussed in connection with FIG. 1 in that it enables a wide variety of lead wires to be used in connection with any particular component and facilitates the handling, testing and inventorying of the components during manufacture. Where the thimble is being utilized, as in the instant case, with a hermetically sealed device it is essential that the flattened or offset portion 26 be completely closed so as to prevent leakage in the component.

Figures 3, 7:
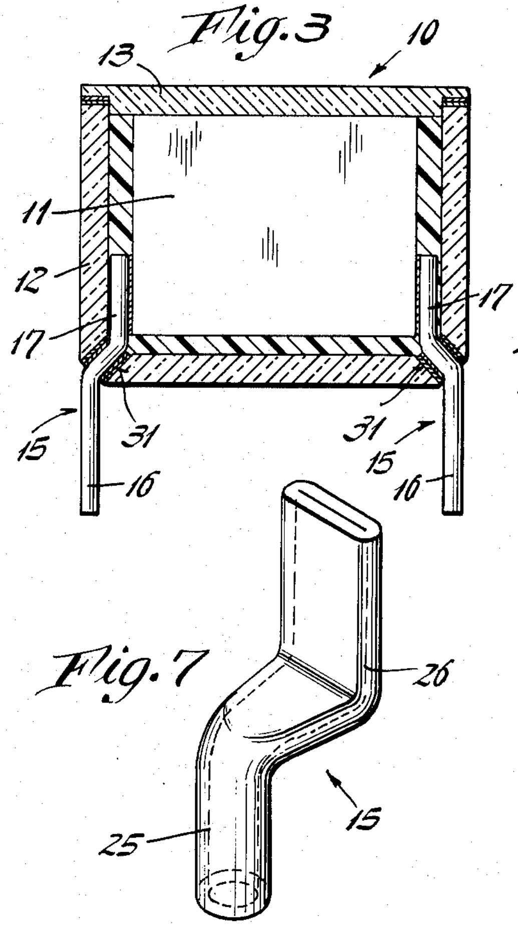
FIGS. 3 and 4 are similar to FIGS. 1 and 2, but show modifications thereof.
FIG. 7 is a perspective view of one form of terminal means according to the invention.
Figure 4:
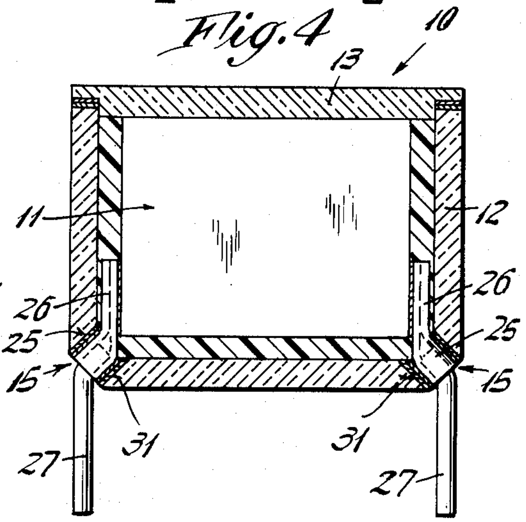

FIGS. 3 and 4 are substantially identical to FIGS. 1 and 2, respectively, except that the openings in the closed end of the casing are formed at the corners thereof, as shown at 31, so that the center line of the portion of the terminal means 15 projecting outwardly of the casing, for connecting the component into the electrical circuit, is aligned with the center line of the side edges of the casing and is maintained in such position, as required by many printed circuit specifications. In FIG. 3 the terminal means or lead wire proper 16 has its center line in alignment with the center line of the side edges of the casing and in FIG. 4 the tubular body portion 25 of the terminal means maintains the preformed lead wire 27 in proper position with respect to the side walls of the casing. It will be understoood that with the modified construction shown in FIGS. 3 and 4, minor variations in configuration of the offset portion of the terminal means must be resorted to, as shown, in order to maintain the desired relationship between the terminal means and the inserted component 11.

Figure 5:
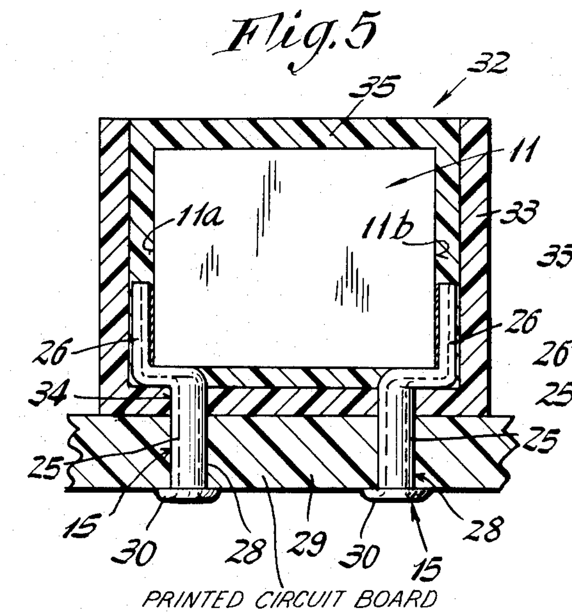
FIG. 5 is a side elevational view, in section, of an encapsulated capacitor according to the invention shown mounted directly on a printed circuit board.
Figure 6:
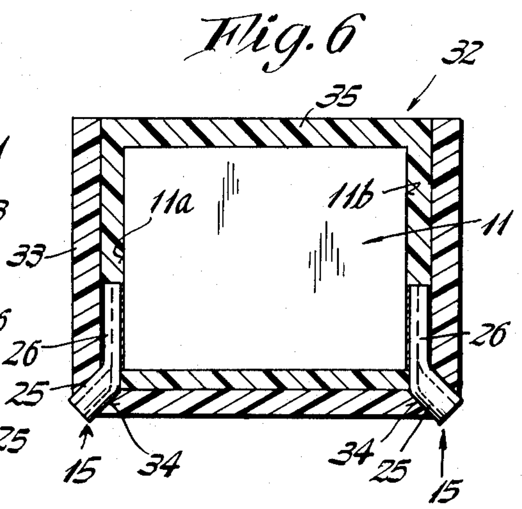
FIG. 6 is a side elevational view, in section, of an encapsulated capacitor according to the invention.

Referring now to FIGS. 5 and 6, the concepts of the invention are shown in a conventional non-sealed encapsulated component 32. While in these embodiments of the invention the casing 33 of the component may be formed of a ceramic material, as described in connection with casings of FIGS. 1 through 4, it may also be formed of plastic or similar insulating and shock absorbing material, as shown. The casings 33 are provided with a plurality of openings 34 in their closed ends, similar to the openings 14 and 31 of FIGS. 1 through 4, and are fitted with terminal means 15, which may take the form of that shown in FIG. 1 or, as illustrated, the thimble form of FIG. 7. The terminal means may have a friction fit with the casing, may be molded in or secured by any other known means.

After the casing and terminal means 15 are assembled, the component body 11 is inserted into the casing, through its open end, between the offset portion of the terminal means and the required electrical connections are made as aforedescribed. In the illustrated form of the invention the connections are made to the electrodes 11*a* and 11*b* of the capacitor body 11 at the solder joints 20*a* and 21*a*.

The encapsulated component 32 is completed by conventional potting procedures, so that all voids are filled with epoxy or similar material 35 and the component body 11 is completely insulated and protected.

Thus, among others, the several objects and advantages of the invention as aforenoted are achieved. Obviously numerous changes in the structure may be resorted to without departing from the spirit of the invention as defied by the claims.

We claim:

1. An encapsulated electrical component comprising a component body having specific electrical characteristics; a unitary open ended casing adapted to house said body and having upstanding side wall means and a closed end portion, said body being inserted through said open end, said casing being formed with a plurality of spaced openings in the closed end portion thereof; terminal means disposed in each of said openings and communicating outwardly thereof, said terminal means each including a tubular body portion positioned in its respective opening in said casing, said tubular body portion having an open end exposed outwardly of said casing, and a substantially flattened foot portion formed integral with said tubular body portion and offset therefrom, said foot portion extending inside said casing adjacent and parallel said upstanding side wall means, said offset foot portions being predeterminately spaced to receive said body, said body being positioned in a predetermined manner between said offset foot portions in electrical engagement therewith, whereby said body is electrically communicated outwardly of said casing through said terminal means for connection in an electrical circuit; and potting means filling the voids in said casing between the walls thereof and said component body.

2. An encapsulated electrical component as defined in claim 1, and a lead wire positioned in the tubular portion of each terminal means through the open end thereof, said lead wires being electrically connected to the respective terminal means for connecting the component in an electrical circuit.

3. An encapsulated electrical component as defined in claim 1, wherein the tubular portions of said terminal means protrude outwardly of the outline of said casing through their respective openings, whereby they are adapted to be inserted through openings in printed circuit boards and peened over for connecting the component in an electrical circuit.

References Cited by the Examiner

UNITED STATES PATENTS

| | | | |
|---|---|---|---|
| 1,382,753 | 6/1921 | Tefft | 339—277 X |
| 2,151,885 | 3/1939 | Baier | 174—50 X |
| 2,163,410 | 6/1939 | Pulfrich et al. | |
| 2,481,806 | 9/1949 | Wolfskill | 174—50 X |
| 2,698,372 | 12/1954 | Patla | 317—242 X |
| 2,842,699 | 7/1958 | Germeshausen et al. | 65—43 X |
| 2,947,964 | 8/1960 | Johanson et al. | 339—220 X |
| 3,023,492 | 3/1962 | Bristow | 65—43 X |
| 3,037,070 | 5/1962 | Sussman et al. | 174—50 X |
| 3,056,939 | 10/1962 | Rayburn | 317—101 X |
| 3,082,350 | 3/1963 | Gulbrandsen | 174—50 X |
| 3,086,149 | 4/1963 | Baron | 174—52 X |
| 3,151,210 | 9/1964 | Hennessey | 174—52 X |

FOREIGN PATENTS

| | | |
|---|---|---|
| 697,713 | 9/1940 | Germany. |

OTHER REFERENCES

Markus, J.: "Materials for Electronics," in Electronics, October 1956, page 186.

JOHN F. BURNS, *Primary Examiner.*

DARRELL L. CLAY, *Examiner.*